United States Patent [19]
Graybill

[11] Patent Number: 5,353,024
[45] Date of Patent: Oct. 4, 1994

[54] METHOD FOR DATA COMPRESSION HAVING AN IMPROVED ENCODING ALGORITHM WHICH UTILIZES A TOKEN STACKING TECHNIQUE

[75] Inventor: Mark D. Graybill, Agoura, Calif.

[73] Assignee: Intersecting Concepts, Inc., Agoura Hills, Calif.

[21] Appl. No.: 877,088

[22] Filed: May 1, 1992

[51] Int. Cl.$^5$ .............................................. H03M 7/30
[52] U.S. Cl. ........................................ 341/51; 341/87
[58] Field of Search ........................ 341/51, 55, 60, 67, 341/79, 87, 95, 106; 364/260.06

[56] References Cited

U.S. PATENT DOCUMENTS

| | | |
|---|---|---|
| 3,914,586 | 10/1975 | McIntosh . |
| 3,976,844 | 8/1976 | Betz . |
| 4,021,782 | 5/1977 | Hoerning . |
| 4,054,951 | 10/1977 | Jackson et al. . |
| 4,087,788 | 5/1978 | Johannesson . |
| 4,295,124 | 10/1981 | Roybal . |
| 4,412,306 | 10/1983 | Moll . |
| 4,464,650 | 8/1984 | Eastman et al. . |
| 4,491,934 | 1/1985 | Heinz . |
| 4,538,240 | 8/1985 | Carter et al. . |
| 4,558,302 | 12/1985 | Welch . |
| 4,560,976 | 12/1985 | Finn . |
| 4,586,027 | 4/1986 | Tsukiyama et al. . |
| 4,588,985 | 5/1986 | Carter et al. . |
| 4,612,532 | 9/1986 | Bacon et al. . |
| 4,677,649 | 6/1987 | Kunishi et al. . |
| 4,682,150 | 7/1987 | Mathes et al. . |
| 4,701,745 | 10/1987 | Waterworth . |
| 4,730,348 | 3/1988 | MacCrisken . |
| 4,758,899 | 7/1988 | Tsukiyama . |
| 4,809,350 | 2/1989 | Shimoni et al. . |
| 4,814,746 | 3/1989 | Miller et al. . |
| 4,853,696 | 8/1989 | Mukherjee . |
| 4,872,009 | 10/1989 | Tsukiyama et al. . |
| 4,876,541 | 10/1989 | Storer . |
| 4,906,991 | 3/1990 | Fiala et al. . |
| 4,929,946 | 5/1990 | O'Brien et al. . |
| 4,949,302 | 8/1990 | Arnold et al. ................ 395/375 |
| 4,979,039 | 12/1990 | Kisor et al. . |
| 4,988,998 | 1/1991 | O'Brien . |
| 5,003,307 | 3/1991 | Whiting et al. . |
| 5,010,553 | 4/1991 | Scheller et al. . |

(List continued on next page.)

FOREIGN PATENT DOCUMENTS 0338899 10/1989 European Pat. Off. .

OTHER PUBLICATIONS

J. Cleary et al., "Date Compression Using Adaptive Coding and Partial String Matching", *IEEE Transactions on Communications*, 32:396-403 (1984).

(List continued on next page.)

*Primary Examiner*—Brian K. Young
*Attorney, Agent, or Firm*—Merchant & Gould

[57] ABSTRACT

The present invention is a data compression method having an improved encoding algorithm which utilizes a token stacking technique. The essential step of the present invention encoding method is constructing a group of stacked tokens. Each stacked token has multiple fields including a substring length counter field and a backward displacement pointer field, where the former is identical among all stacked tokens for serving as the basis in constructing the group of stacked tokens, and the latter is assigned with a respective range of integers. The ranges assigned to the stacked tokens are stacked sequentially without overlapping. The encoding method further comprises the steps of determining a backward displacement pointer for a compressible substring and encoding the backward displacement pointer into a respective stacked token according to the range assigned, such that the backward displacement pointer falls within the range assigned to the respective stacked token. The present invention encoding method is particularly effective in saving the number of bytes required for encoding compressible substrings which are remotely located from their respective previously processed identical substrings because the larger backward displacement pointer can be encoded in a stacked token assigned with a stacked and shifted range of backward displacement pointers.

44 Claims, 4 Drawing Sheets

U.S. PATENT DOCUMENTS

| | | |
|---|---|---|
| 5,016,009 | 5/1991 | Whiting et al. . |
| 5,023,610 | 6/1991 | Rubow et al. .......................... 341/51 |
| 5,049,881 | 9/1991 | Gibson et al. . |
| 5,132,992 | 7/1992 | Yurt et al. . |

OTHER PUBLICATIONS

M. Wells, "File Compression Using Variable Length Encodings", *The Computer Journal,* 15:308–313 (1972).

R. P. Brent, "A Linear Algorithm for Data Compression", *The Australian Computer Journal,* 19(2):64–67 (1987).

J. Ziv and A. Lempel, "A Universal Algorithm for Sequential Data Compression", *IEEE Transactions on Information Theory,* IT–23(3):337–343 (1977).

T. C. Bell, "Better OPM/L Text Compression", *IEEE Transactions on Communicatons,* CCOM–34(12):1176–1182 (1986).

D. W. Jones, "Application of Splay Trees to Data Compression", *Communications of the ACM,* 31(8):996–1007 (1988).

E. R. Fiala and D. H. Greene, "Data Compression with Finite Windows", *Communications of the ACM,* 32(4):490–505 (1989).

E. Goto et al., "Parallel Hashing Algorithms", *Information Processing Letters,* 6(1):8–13 (1977).

E. M. McCreight, "A Space-Economical Suffix Tree Construction Algorithm", *Journal of the ACM,* 23(2):262–272 (1976).

T. A. Welch, "A Technique for High Performance Data Compression", *IEEE Computer,* 8–19 (Jun. 1984).

M. Rodeh et al., "Linear Algorithm for Data Compression via String Matching", *Journal of the ACM,* 28(1):16–24 (1981).

V. S. Miller and M. N. Wegman, "Variations on a Theme by Ziv and Lempel" *Conference Record–International Conference on Communications,* (IEEE Service Center, Cat. No. 88CH2538–7) 390–394 (1984).

M. E. Gonzalez-Smith and J. A. Storer, "Parallel Algorithms for Data Compression", *Journal of the Assoc. for Computing Machinery,* 32(2):344–373 (1985).

Storer, J. A., *Data Compression: Methods and Theory,* Computer Sciente Press (1988).

Nelson, M., *The Data Compression Book,* M & T Books (1992).

Storer, J. A. and Reif, J. H. (ed.), *Data Compression Conference 1991,* IEEE Computer Society Press (1991).

Knuth, D. E., *Sorting and Searching, The Art of Computer Programming,* Chapter 6.4, vol. 3, pp. 506–542, Addison Wesley Publishing Co. (1973).

Holloman, D. R., "Technique for Relocatable Chains" IBM Technical Disclosure Bulletin, 14(2):449–451, Jul. 1971.

(T,3,12,X) ENCODED BY T_2B1

(T,3,39,X) ENCODED BY T_2B2

(T,3,82,X) ENCODED BY T_2B2

T'_2B1

T'_2B2

METHOD FOR DATA COMPRESSION HAVING AN IMPROVED ENCODING ALGORITHM WHICH UTILIZES A TOKEN STACKING TECHNIQUE

BACKGROUND OF THE INVENTION

1. Field of The Invention

The present invention generally relates to the field of lossless data compression techniques in processing digital data signals, wherein the digital data signals are compressed and subsequently reconstituted by transforming a body of data to a typically smaller representation from which the original can be reconstructed at a later time. Further, the present invention relates to the field of lossless data compression, wherein the digital data that is compressed and then subsequently decompressed is always kept identical to the original. More particularly, the present invention relates to the field of encoding algorithms for a data compression method which utilizes tokenizing techniques to achieve high compression speed and high compression ratio.

2. Description of The Prior Art

Several methods for performing digital data compression are known in the prior art. Generally, an alphabet is a finite set containing at least one element. The elements of an alphabet are called characters. A string over an alphabet is a sequence of characters, each of which is an element of that alphabet. A common approach to compress a string of characters is textual substitution. A textual substitution data compression method is any data compression method that compresses text by identifying repeated substrings and replacing some substrings by references to other copies. Such a reference is commonly known as a pointer and the string to which the pointer refers is called a target. Therefore, in general, the input to a data compression algorithm employing textual substitution is a sequence of characters over some alphabet and the output is a sequence of characters from the alphabet interspersed with pointers.

The following prior art patents are representative of known prior art data compression methods:

1. U.S. Pat. No. 4,464,650 issued to Eastman et al. on Aug. 7, 1984 for "Apparatus And Method For Compressing Data Signals And Restoring The Compressed Data Signals" (hereafter the "Eastman Patent").
2. U.S. Pat. No. 4,558,302 issued to Welch on Dec. 10, 1985 for "High Speed Data Compression And Decompression Apparatus And Method" (hereafter the "Welch Patent").
3. U.S. Pat. No. 4,586,027 issued to Tsukiyama et al. on Apr. 29, 1986 for "Method And System For Data Compression And Restoration" (hereafter the "Tsukiyama '027 Patent").
4. U.S. Pat. No. 4,560,976 issued to Finn on Dec. 24, 1985 for "Data Compression" (hereafter the "Finn Patent").
5. U.S. Pat. No. 3,914,586 issued to Mcintosh on Oct. 21, 1975 for "Data Compression Method And Apparatus" (hereafter the "Mcintosh Patent").
6. U.S. Pat. No. 4,682,150 issued to Mathes et al. on Jul. 21, 1987 for "Data Compression Method And Apparatus" (hereafter the "Mathes Patent").
7. U.S. Pat. No. 4,872,009 issued to Tsukiyama et al. on Oct. 3, 1989 for "Method And Apparatus For Data Compression And Restoration" (Hereafter the "Tsukiyama '009 Patent").
8. U.S. Pat. No. 4,758,899 issued to Tsukiyama on Jul. 19, 1988 for "Data Compression Control Device" (Hereafter the "Tsukiyama '899 Patent").
9. U.S. Pat. No. 4,809,350 issued to Shimoni et al. on Feb. 28, 1989 for "Data Compression System" (hereafter the "Shimoni Patent").
10. U.S. Pat. No. 4,087,788 issued to Johannesson on May 2, 1978 for "Data Compression System" (hereafter the "Johannesson Patent").
11. U.S. Pat. No. 4,677,649 issued to Kunishi et al. on Jun. 30, 1987 for "Data Receiving Apparatus" (hereafter the "Kunishi Patent").
12. U.S. Pat. No. 5,016,009 issued to Whiting et al. on May 14, 1991 for "Data Compression Apparatus and Method" (hereafter "the '009 Whiting Patent").
13. U.S. Pat. No. 5,003,307 issued to Whiting et al. on Mar. 26, 1991 for "Data Compression Apparatus with Shift Register Search Means" (hereafter "the '307 Whiting Patent").
14. U.S. Pat. No. 5,049,881 issued to Gibson and Graybill on Sep. 17, 1991 for "Apparatus and Method For Very High Data Rate- Compression Incorporating Lossless Data Compression And Expansion Utilizing A Hashing Technique" (hereafter "the '881 Patent").

In general, as illustrated by the above patents, data compression systems are known in the prior art that encode a stream of digital data signals into compressed digital code signals and decode the compressed digital code signals back into the original data. Various data compression systems are known in the art which utilize special purpose compression methods designed for compressing special classes of data. The major drawback to such systems is that they only work well with the special class of data for which they were designed and are very inefficient when used with other types of data. The following compression systems are considered general purpose.

The best known and most widely used general purpose data compression procedure is the Huffman method. The Huffman method maps fixed length segments of symbols into variable length words. The Huffman method further involves calculating probabilities of the occurrences of certain symbols and establishing a tree having leaves for symbols with certain probabilities and new nodes established from lower probability symbols which nodes are also placed on the tree.

The Huffman method of data compression has many limitations. The encoding procedure of the Huffman method requires prior knowledge of the statistical characteristics of the source data. This is cumbersome and requires considerable working memory space. In addition, the Huffman method requires intensive calculations for variable bit compression. Moreover, the Huffman method requires a dictionary in the output stream for reconstruction of the digital signal or requires a prior knowledge of the dictionary which limits the applicability to specific types of data.

A second well known data compression technique is the Tunstall method, which maps variable length segments of symbols into fixed length binary words. The Tunstall method also has many of the disadvantages of the Huffman method and further has the constraint that the output string consists of fixed length binary words.

The third well known data compression technique is the group of the Lempel-Ziv ("LZ") methods. A typical LZ method maps variable-length segments of symbols into various length binary words. A problem with the LZ methods is that the required memory space grows at a non-linear rate with respect to the input data. An improved variation of the LZ method is disclosed by and claimed in the Eastman Patent. This new method taught in the Eastman Patent, however, has several major disadvantages: (a) the method requires the creation of a searchtree database and therefore requires storage room for the dictionary; (b) the amount of achievable compression is heavily dependent on the dictionary; (c) management and searching of the dictionary is time consuming, yielding low data rate-compression factor product; (d) the growth characteristics of the dictionary requires N-1 input data string occurrences of string of length N in order to establish string in the dictionary. This results in reduced compression efficiency; and (e) in the worst case, the growth of output data block is tied directly to the size of the dictionary. Making the dictionary larger can improve overall compression for compressible data, but yield larger percentage growths for incompressible data because more bits are required to represent fixed length dictionary pointers. Finally, the dictionary must be reconstructed during expansion, resulting in a slower reconstitution rate and more required memory space.

The method disclosed in the Welch Patent is very similar to the LZ method described in the Eastman Patent and also includes all of the basic problems of the Eastman Patent method. The basic difference is that instead of storing the dictionary in a tree node type structure, the Welch Patent method is explicitly compressing an input stream of data character signals by storing in a string table strings of data character signals encountered in the input streams. This has the additional disadvantage of requiring more storage than the LZ method. While it does provide the advantage of being faster if the number of strings that must be searched is small it still has the poor dictionary growth characteristics of other LZ methods, such as the one disclosed by the Eastman Patent.

The data compression algorithms disclosed by the two Whiting Patents are very similar. The '009 Whiting Patent disclosed a data compression algorithm which maintains an independent "history array means" as a separate dictionary of input data. It also maintains an "offset array means" which is a supportive linking table in addition to a hash table. The '307 Whiting Patent discloses a data compression algorithm which maintains an independent "shift register" as a separate dictionary of input data. It further utilizes a broadcast channel for searching simultaneously the entries of the shift register for matching substrings. However, both Whiting Patents suffer the drawback of having a "history means" which requires additional memory and processing time.

The remaining patents which discuss compression algorithms include in the process the requirement of creating a dictionary, either in the form of a tree or a series of strings or similar arrangement which requires substantial memory and storage for the dictionary or the strings and the time consuming process of searching the dictionary, yielding a low data rate-compression factor product. There is a significant need for an improved method for compressing data which eliminates the problems discussed above and provides a faster and more efficient method of compressing the data while at the same time retaining most of the advantages of prior systems.

The '881 Patent discloses a method and apparatus for compressing digital data that is represented as a sequence of characters drawn from an alphabet. An input data block is processed into an output data block composed of sections of variable length. Unlike most other prior art methods which emphasize the creation of a dictionary comprised of a tree with nodes or a set of strings, the method disclosed in the '881 Patent creates its own pointers from the sequence characters previously processed and emphasizes the highest priority on maximizing the data rate-compression factor product.

One of the many advantages of the '881 Patent is that the compressor can process the input data block very quickly, due to the use of previously input data acting as the dictionary combined with the use of a hashing algorithm to find candidates for string matches and the absence of a traditional string matching table and associated search time. The result of the method disclosed in the '881 Patent is a high data rate-compression factor product achieved due to the absence of any string storage table and matches being tested only against one string.

A typical data compression method includes two essential algorithms: a matching algorithm and an encoding algorithm. These two essential algorithms are relatively independent of each other. In pursuing a data compression method with higher compression ratio and higher compression speed, the present invention disclosed a new encoding algorithm which utilizes a token stacking technique. This new encoding algorithm, when incorporated with the matching algorithm disclosed by the '881 Patent, can enhance the performance of the data compression process. Moveover, this new encoding algorithm may be incorporated with any other matching algorithm incorporated with other data compression algorithms and enhance their performance by improving the encoding algorithm.

SUMMARY OF THE INVENTION

The present invention is a data compression method having an improved encoding algorithm which utilizes a token stacking technique.

It is known that the encoding algorithms utilized in many digital data compression methods employ various indicators to introduce and represent incompressible and compressible data substrings. For example, the encoding algorithm disclosed by the '881 Patent utilizes substring type identifiers, substring length counters and backward displacement pointers.

The substring type identifier is employed to identify the type of the encoded data substring as to whether it is an incompressible data substring or a compressible data substring; the substring length counter is employed to count the number of characters in the encoded data substring; and the backward displacement pointer is employed to indicate that the compressed data substring is a duplicate copy of the data substring at the position going back B characters. Of course some other extra substring indicators may also be utilized to represent other necessary information of the encoded substrings.

Therefore, a typical group of indicators in the encoded data string may be represented as (T, C, B, X), where T represents the substring type identifier, C represents the substring length counter, B represents the backward displacement pointer and X represents any additional indicators. Such a group of indicators is often called the "token" of the respective encoded substring.

A typical token may be a 2-byte or 3-byte encoded substring, where there are 8 bits in each byte. Each indicator encoded in the 2- or 3-byte token will occupy a certain number of bits, which is often referred to as the "field" of that particular indicator, and that particular number of bits is denoted as the field length of that particular indicator.

It has been discovered, according to the present invention, however, that such encoding algorithm may not achieve the most efficient compression result, particularly when there are a lot of short compressible substrings located far away from their original appearance. The reason is that for the remote compressible substring, the backward displacement pointer B is a large number and needs a larger field to be encoded.

For example, if a 2-byte token is used wherein 5 bits are assigned to the backward displacement pointer field for encoding the backward displacement pointer B in binary format, then only a number within the range from 0 to 31 can be encoded. If the backward displacement pointer B is larger than 31, e.g. 80, then two additional bits are needed to encode the number 80 and quite often the 2-byte token is no longer adequate and a 3-byte token is needed. This often results in an increased number of total bytes for encoding the whole input data string.

It has also been discovered, according to the present invention, that when a larger sized field is used for encoding a backward displacement pointer B, part of the range represented is repetitive as compared to a smaller sized field. For example, in binary format, a 6-bit field can encode number 0 through 63. However, a subrange (0 through 31) of this larger range (0 through 63) has already been represented by a 5-bit field.

It has further been discovered, according to the present invention, that if a group of smaller sized tokens are linked through a stack technique, then the group of smaller sized tokens can be used to encode a larger indicator without the need to invoke a large sized token. For example, the smaller sized group may consist of two 2-byte tokens: a first 2-byte token having a 5-bit backward displacement pointer field, and a second 2-byte token having a 6-bit backward displacement pointer field. Normally a 6-bit field can only be used to encode a number within the range of 0 through 63. Thus to encode a large number, e.g., 82, will require a 7-bit field and that in turn often requires a token having 3 bytes space.

However, if the first and second 2-byte token are linked with a stacking technique, such that the range of numbers represented by the 6-bit field in the second 2-byte token is shifted by 32 numbers, then the 6-bit field of the second 2-byte token can be used to encode the range of numbers from 32 to 95, and leave the range of numbers from 0 to 31 solely represented by the first 2-byte token. Additionally, no 3-byte token is needed for backward displacement pointers less than or equal to 95. Thus, the same large number 82 can be encoded by the 6-bit field of the second 2-byte token.

It has additionally been discovered, according to the present invention, that if the field length of another indicator of the encoded substrings is kept identical in the group of smaller sized tokens, then the field of that indicator can serve as a building block of the stacking technique to link these smaller sized tokens. For example, the substring length counter C can be kept in a fixed field in all linked 2-byte tokens to signify that the backward displacement pointers in these 2-byte tokens are to be stacked.

It is therefore an object of the present invention to provide an encoding algorithm utilizing a token stacking technique, which can achieve the most efficient compression result, particularly for an input data string which contains a lot of short compressible substrings located far away from their original appearance.

It is also an object of the present invention to provide an encoding algorithm utilizing a token stacking technique, where the ranges of numbers encoded in different tokens do not overlap each other, so larger numbers can be encoded without increasing the size of the tokens.

It is a further object of the present invention to provide an encoding algorithm utilizing a token stacking technique which builds a group of smaller sized tokens, where the ranges of numbers encoded in similar fields of the group of smaller sized tokens are stacked in sequence, so the range of numbers are expanded continuously without missing any intermediate number ranges.

It is a further object of the present invention to provide an encoding algorithm utilizing a token stacking technique, where the field length of the substring length counters of the group of smaller sized tokens are kept identical, so that the substring length counter fields can serve as building blocks of the stacking technique to link these smaller sized tokens.

Described generally, the present invention is a data compression method having an improved encoding algorithm which utilizes a token stacking technique. The novel and critical step of the present invention encoding method is to construct a group of stacked tokens each having a multiplicity of fields including a substring length counter field and a backward displacement pointer field. The unique and essential feature of the present invention stacked tokens is that the substring length counter field is identical among all stacked tokens for serving as the basis in constructing the group of stacked tokens, and the backward displacement pointer field is assigned with a respective range of integers. A further unique feature of the present invention encoding method is that the ranges assigned to the stacked tokens are stacked sequentially without overlapping.

In addition, the present invention encoding method further includes the steps of determining a backward displacement pointer for a compressible substring and encoding the backward displacement pointer into a respective stacked token according to the range assigned therefor, such that the backward displacement pointer falls within the particular range assigned to that respective stacked token.

Moreover, the present invention encoding method is particularly effective in saving the number of bytes required for encoding compressible substrings which are located remotely from their respective previously processed identical substrings, because the larger backward displacement pointer can be encoded in one of the stacked tokens that has been assigned with a stacked and shifted range of backward displacement pointers.

The present invention token stacking technique may be utilized with any matching system and any tokenizing system in which each token has two or more independent variables (fields). The two variables of interest in each token may be the backwards distance and the copy count in the algorithm disclosed in the '881 Patent; or the offset from the beginning of the window of scanned text and the copy count in a modified LZ77 type algorithm; or the pointer to the dictionary entry and the copy count in a traditional LZ78 type algorithm.

The general concept of the stacking technique is as follows: If there are two independent variables and each token is constructed with two degrees of freedom, no stacking technique is possible. However, if the freedom of one of the variables is restricted, then stacking the other one is possible. It does not matter what the two variables represent; it only matters that they are independent. In other words, using a multiplicity of tokens in which the range of one variable is fixed over the family of tokens allows a stacking technique on the remaining variables. The role of the variables could be switched with possibly equally favorable results.

In summary, the token stacking technique can be used in any tokenizing system that satisfies the following constraints: (a) each token has two or more independent variables (fields); and (b) the tokenizing system uses two or more tokens with similar variables.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Figure 1:
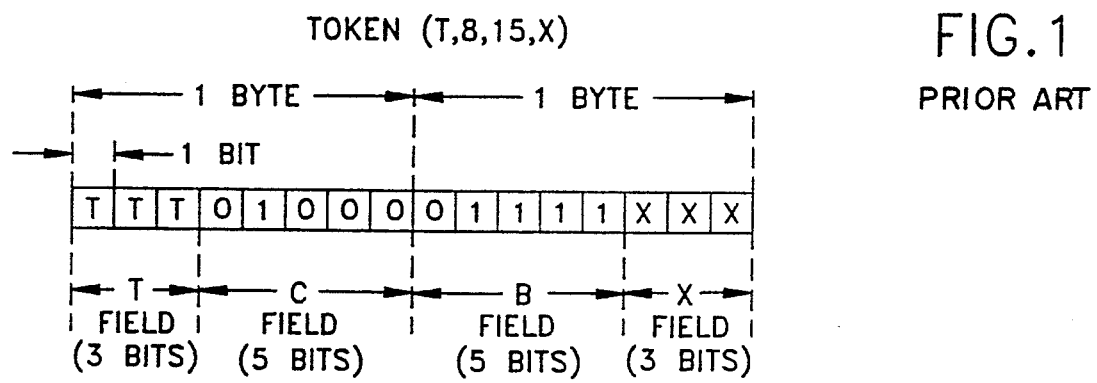
FIG. 1 is an illustrative diagram showing the conventional structure of a typical 2-byte token (T, 8, 15, X).

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

As introduced earlier, the present invention token stacking technique may be utilized with any matching system and any tokenizing system that satisfies the following constraints: (a) each token has two or more independent variables (fields); and (b) the tokenizing system uses two or more tokens with similar variables. The two variables of interest in each token may be the backwards distance and the copy count in the algorithm disclosed in the '881 Patent; or the offset from the beginning of the window of scanned text and the copy count in a modified LZ77 type algorithm; or the pointer to the dictionary entry and the copy count in a traditional LZ78 type algorithm. However, to illustrate best the present invention, a particular embodiment incorporating the backwards distance pointer and the copy count pointer of the '881 Patent is discussed in detail here.

The data compression method disclosed in the '881 Patent utilized an encoding algorithm which employs type identifiers, length counters and backward displacement pointers to introduce and represent compressible and incompressible data substrings.

According to the algorithm disclosed in the '881 Patent, the encoding algorithms utilized in some digital data compression methods generally employ various indicators to introduce and represent incompressible and compressible data substrings. Typical substring indicators may include substring type identifiers T, substring length counters C and substring backward displacement pointers B. The substring type identifier is employed to identify the type of the encoded data substring as to whether it is an incompressible data substring or a compressible data substring; the substring length counter is employed to count the number of characters in the encoded data substring; and the backward displacement pointer B is employed to indicate that the compressed data substring is a duplicate copy of the data substring at the position going back B utilized to represent other necessary information of the encoded substrings. For example, when the compressed substrings and uncompressed substrings are mixed in a series which is the output data string, the additional indicator X of one substring may carry information of that substring or information of a preceding substring or a following substring in the series. Therefore, a typical group of indicators in the encoded data string may be represented as (T, C, B, X). Such a group of indicators can be called a multi-indicator "token" of the respective encoded substring.

Take the following sentence as a sample input data string which contains a series of data substrings:
ONE OF THE OBJECTS OF THE PRESENT INVENTION METHOD 0F THE DATA COMPRESSION IS TO COMPRESS INPUT STRING OF THE DATA BY USING A TOKEN TO DEPICT A COMPRESSIBLE SUBSTRING.

It is noted that the substring "compress" appears three times in the sample input data string. When it first appears, it is treated as an incompressible substring. This first appearance of substring "compress" is encoded in its original uncompressed form ("compress") in the output data string and is often referred to as the "original copy" of the substring "compress". However, when the same substring "compress" appears the second time, it can be depicted or represented by a token:

(T, 8, 15, X)

where T is the substring type identifier (T) for a compressible substring, 8 is the substring length counter (C) indicating that the substring "compress" contains 8 characters, 15 is the backward displacement pointer (B) indicating that the displacement of the second substring "compress" from the original copy (not counting spaces), and X is an additional indicator.

Similarly, the third substring "compress" can also be depicted by a token:

(T, 8, 65, X)

The original copy of the substring "compress" will require 8 bytes for encoding in binary format, i.e., each character takes 1 byte. If not represented by token, each subsequent appearance of substring "compress" will also take 8 bytes to encode. However, each subsequent appearance of substring "compress" can be depicted by a respective token, and such a token normally takes less bytes to encode.

As introduced earlier, a typical token may be encoded in 2 or 3 bytes. When a multi-indicator token is encoded, each indicator of the token is encoded in its respective field which occupies a certain number of bits, and that particular number of bits is denoted as the field length of that particular indicator. In binary format (in the following description, if not otherwise specified, it is assumed that all encodings are done in the binary format), a 5-bit field can be used to encode a number within the range of 0 ("00000") through 31 ("11111" in binary format), a 6-bit field can be used to encode a number within the range of 0 ("00000") through 63 ("111111"), and so on.

Referring to FIG. 1, there is shown how token (T, 8, 15, X) is normally encoded. Suppose the substring type identifier T and the additional indicator X each occupies a 3-bit field respectively denoted by "TTT" and "XXX", and the substring length counter C and backward displacement pointer B each occupies a 5-bit field. In binary format the number 8 (for substring length indicator C) is encoded as "1000" and the number 15 (for backward displacement pointer B) is encoded as "11111":

TTT01000 01111XXX

Therefore, token (T, 8, 15, X) is encoded within 2bytes, which represents a 6-byte saving by compression as compared to encoding the second substring "compress" in its uncompressed 8-byte form.

Figure 2:
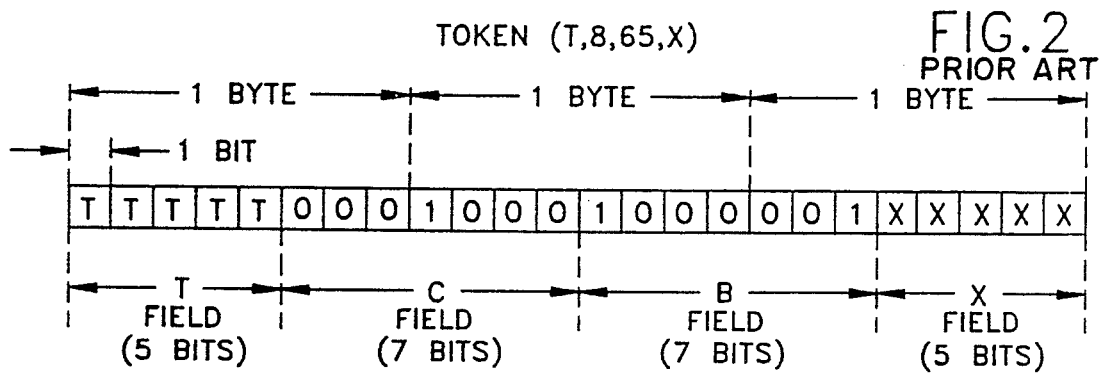
FIG. 2 is an illustrative diagram showing the conventional structure of a typical 3-byte token (T, 8, 65, X).

If the subsequent substring appears remotely from the original copy, then 2 bytes are probably not enough for encoding its token because the backward displacement pointer B is a large number and its field length is not long enough to encode it. For example, in the second token (T, 8, 65, X), the backward displacement pointer B is 65, which requires 7 bits to be encoded (as "1000001"). In such a case a 3-byte token is needed because it can provide 8 more bits space, as shown in FIG. 2:

TTTTT000 10001000 001XXXXX

Using an additional byte in this case is probably acceptable because there is still a 5-byte saving as compared to the 8-bytes needed for encoding the substring "compress" in its original uncompressed form. However, when the compressible substring is a short one, such as a 4-byte substring, using a 3-byte token is highly undesirable, if a 2-byte token can be used, because it reduces the compression ratio significantly (2:4 vs. 3:4).

Figure 3:
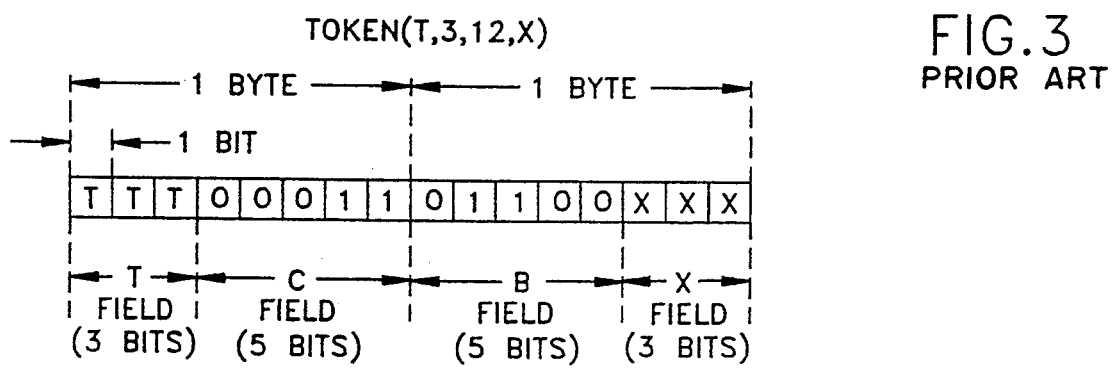
FIG. 3 is an illustrative diagram showing the conventional encoding format of the token (T, 3, 12, X) which takes 2 bytes.

Again using the sample sentence for illustrative purposes, it can be noted that the substring "the" appears 4 times. The first appearance is the original copy and is encoded in its uncompressed form which takes 3 bytes. The second substring "the" can be depicted by a 2-byte token (T, 3, 12, X), as shown in FIG. 3:

TTT00011 01100XXX

Figure 4:
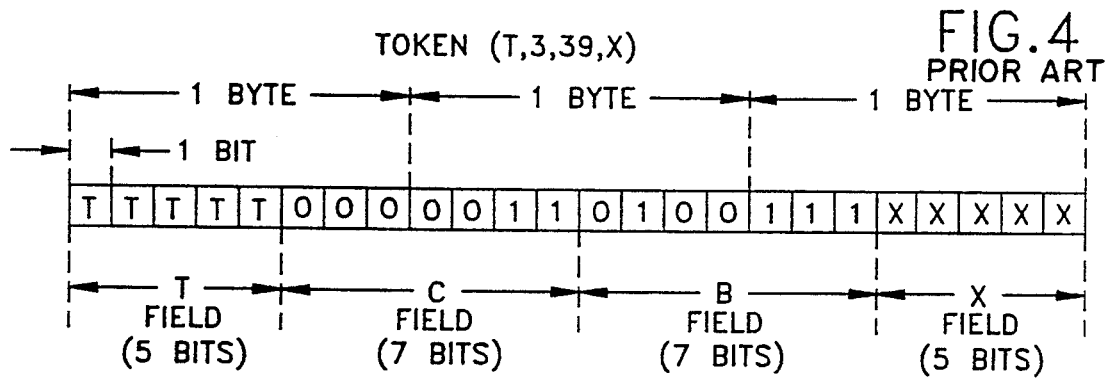
FIG. 4 is an illustrative diagram showing the conventional encoding format of the token (T, 3, 39, X) which takes 3 bytes.

The third substring "the" can be depicted by a token (T, 3, 39, X). Since it is remote from the original copy, the backward displacement pointer B is a large number 39, which requires at least 6 bits to encode (as "100111"). The format of the 2-byte token shown in FIG. 1 is no longer adequate to encode the token (T, 3, 39, X) since the backward displacement pointer field is only 5 bits. Therefore, it requires a 3-byte token wherein more bits can be assigned to the backward displacement pointer field, as shown in FIG. 4:

TTTTT000 00110100 111XXXXX

Figure 5:
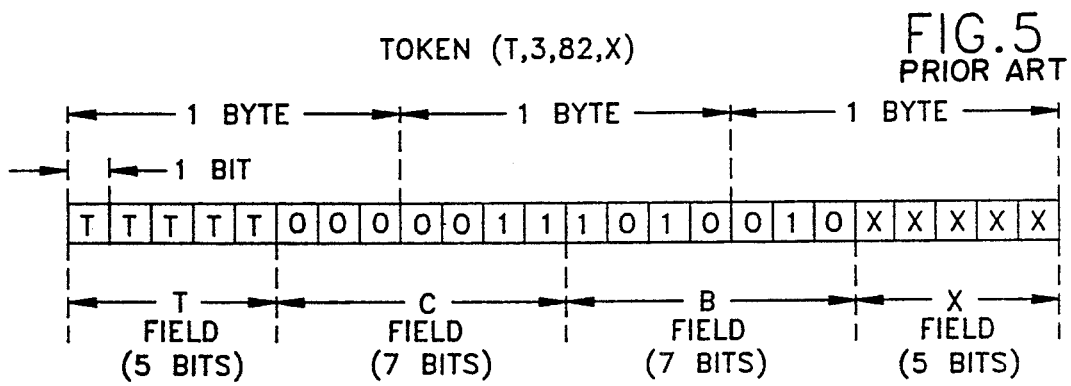
FIG. 5 is an illustrative diagram showing the conventional encoding format of the other token (T, 3, 82, X) which also takes 3 bytes.

Similarly, the token for the very remote fourth substring "the", which is (T, 3, 82, X), also needs 3 bytes to encode, because the backward displacement pointer B now is a very large number 82 which requires at least 7 bits to encode (as "1010010"), as shown in FIG. 5:

TTTTT000 00111010 010XXXXX

It is preferred, however, to use the shorter (e.g., 2-byte) token for representing a compressible substring to achieve a higher compression rate, particularly when the compressible substring itself is a short one that only takes 3 or 4 bytes to encode in its original form, such as substring "the" or "data". Using a 3-byte token to represent a 3 or 4-byte compressible substring is very undesirable because it does not provide any significant saving in encoded bytes. On the other hand, it seems that 3 bytes are necessary for encoding the token representing a compressible substring which is very remote from its original copy and requires a longer field length for the backward displacement pointer.

The novelty of the present invention data compression method is that it finds a unique solution to the above problem. Instead of using a 3-byte token to represent the compressible substring which is remote from the original copy, the present invention encoding algorithm utilizes a token stacking technique, which assembles two or more 2-byte tokens in a group, based on a common token building block and according to a predetermined pattern.

In one of the preferred embodiments of the present invention method, the group of stacked tokens comprises three 2-byte stacked tokens T_2B1, T_2B2 and T_2B3. The three 2-byte stacked tokens are constructed in a particular manner which relates them inherently.

Figure 6:
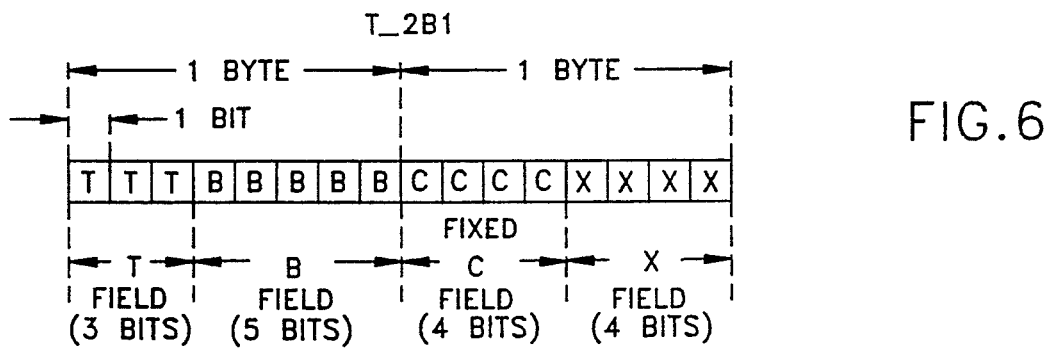
FIG. 6 is an illustrative diagram showing the structure of the first 2-byte stacked token T_2B1 of a group of 2-byte stack tokens according to a preferred embodiment of the present invention.

Referring to FIG. 6, the first 2-byte stacked token T_2B1 has variable 3-bit substring type identifier field denoted as "TTT", a variable 5-bit backward displacement pointer field denoted as "BBBBB", a fixed 4-bit length counter field denoted as "CCCC", and a variable 4-bit additional indicator field denoted as "XXX":

TTTBBBBB CCCCXXXXX

Figure 7:
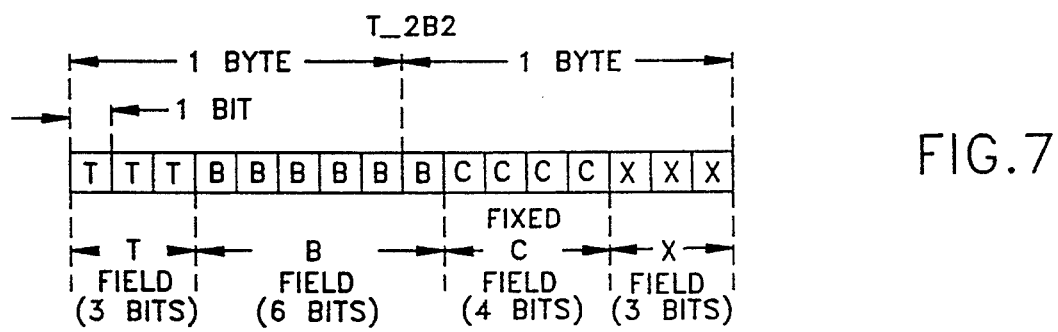
FIG. 7 is an illustrative diagram showing the structure of the second 2-byte stacked token T_2B2 of the group of 2-byte stack tokens according to the preferred embodiment of the present invention.

Referring to FIG. 7, the second 2-byte stacked token T_2B2 has variable 3-bit substring type identifier field denoted as "TTT", a variable 6-bit backward displacement pointer field denoted as "BBBBBB", a fixed 4-bit length counter field denoted as "CCCC", and a variable 3-bit additional indicator field denoted as "XXX":

TTTBBBBB BCCCCXXX

Figure 8:
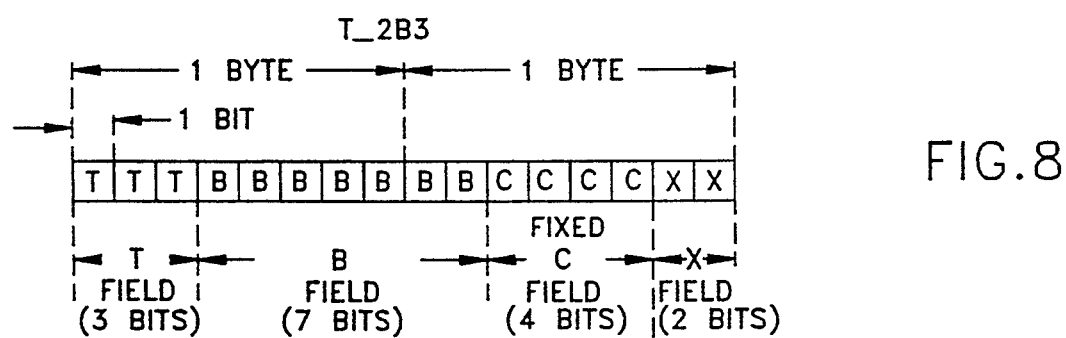
FIG. 8 is an illustrative diagram showing the structure of the third 2-byte stacked token T_2B3 of the group of 2-byte stack tokens according to the preferred embodiment of the present invention.

Referring to FIG. 8, the third 2-byte stacked token T_2B3 has variable 3-bit substring type identifier field denoted as "TTT", a variable 7-bit backward displacement pointer field denoted as "BBBBBBB", a fixed 4-bit length counter field denoted as "CCCC", and a variable 2-bit additional indicator field denoted as "XX":

TTTBBBBB BBCCCCXX

It is noted that it is not necessary to take into account the additional indicator field X because as mentioned earlier it is optional and somewhat arbitrary. The novelty and uniqueness of the present invention method introduced here will not be effected by the presence or absence of the field of the additional indicator X.

The unique aspect of the three 2-byte stacked tokens utilized in the present invention data compression method is that, in all three 2-byte stacked tokens, the field length of the substring length counter C is fixed. While all other field lengths, particularly that of the backward displacement pointer B, are variable, the field length of the substring length counter C remains consistently at a constant of 4 bits.

The three 2-byte stacked tokens are purposely constructed to have their respective substring length counter field ("CCCC") kept fixed, so that the field "CCCC" can be used as a building block for all 2-byte tokens in this group of stacked tokens. In other words, while other fields may vary, the 4-bit substring length counter field "CCCC" is always there for the encoding and decoding algorithm to recognize as the signifier of the stacked tokens. Therefore, based on this fixed 4-bit substring counter field, the group of stacked tokens are built to be inherently connected, as described below.

It is noted that the first 2-byte token T_2B1 has a 5-bit field ("BBBBB") for encoding the backward displacement pointer B, which can be used to encode numbers within the range of 0 (encoded as "00000") to 31 (encoded as "11111"). In the second 2-byte token T_2B2 the field length for encoding the backward displacement pointer B is 6 bits. A 6-bit field normally can be used only to encode numbers within the range of 0 (encoded as "000000") to 63 (encoded as "111111"). However, since the second 2-byte token T_2B2 is in the same stacked group with the first 2-byte token T_2B1, there is no need to use the second token T_2B2 to encode repeatedly the numbers within the range of 0 to 31. Rather, the range of numbers representable by the backward displacement pointer field is shifted by 32. Instead of being used to encode numbers within the range of 0 to 31, the 6-bit backward displacement pointer field in the second 2-byte token T_2B2 is used to encode numbers within the range of 32 to 95.

Constructed in this manner, the 6-bit backward displacement pointer field in the second 2-byte token T_2b2 represents a new set of 64 numbers ranging from 32 to 95. If encoded as "000000" it represents number 32 but not 0, and if encoded as "111111" it represents number 95 but not 63. Hence, the second 2-byte token T_2b2 now can be used to encode a large backward displacement pointer, which previously requires 3 bytes to encode.

Similarly, the range of numbers representable by the 7-bit field of the backward displacement pointer in the third 2-byte token T_2B3 now is shifted by 96. Instead of being used to encode numbers within the range of 0 to 127, the 7-bit backward displacement pointer field in the third 2-byte token T_2B3 is used to encode numbers within the range of 96 (encoded as "0000000") to 223 (encoded as "1111111").

In summary, conventionally, the ranges of numbers which can be respectively encoded into a 5-bit, a 6-bit and a 7-bit field are:

| | |
|---|---|
| 5-bit field: | 0 to 31 (= $2^5 - 1$) |
| 6-bit field: | 0 to 63 (= $2^8 - 1$) |
| 7-bit field: | 0 to 127 (= $2^7 - 1$) |

Whereas in the three 2-byte stacked tokens utilized in the encoding algorithm of the present invention data compression method, the ranges of numbers which can be respectively encoded into the respective 5-bit, 6-bit and 7-bit backward displacement pointer fields of the three 2-byte stacked tokens are:

| | |
|---|---|
| 5-bit field in T_2B1: | 0 to 31 |
| 6-bit field in T_2B2: | 32 to 95 (= 31 + $2^8$) |
| 7-bit field in T_2B3: | 96 to 223 (= 95 + $2^7$) |

It can be seen that altogether the group of the three 2-byte stacked tokens utilized in the encoding algorithm of the present invention data compression method can be used to encode a much larger range of numbers.

Typically the maximum value of the backward displacement pointer B that can be encoded in a conventional 2-byte token having a 6-bit backward displacement pointer field is 63. Even if a conventional 2-byte token has a 7-bit backward displacement pointer field, the maximum value of the backward displacement pointer B that can be encoded is limited to 127. By utilizing the three 2-byte stacked tokens, the maximum value of the backward displacement pointer B that can be encoded reaches as much as 223. This means an almost twice as large backward displacement pointer B can be encoded without soliciting a 3-byte token. This further saves the bytes needed for the compression algorithms.

Again using the compressible substrings "the" in the sample input data string as an example for illustration, except for the first appearance of substring "the" which serves as the original copy, the three subsequent compressible substrings "the" are representable by the following three tokens respectively:

| | |
|---|---|
| Second "the": | T1 = (T, 3, 12, X) |
| Third "the": | T2 = (T, 3, 39, X) |
| Fourth "the": | T3 = (T, 3, 82, X) |

As previously discussed, these three tokens T1, T2 and T3 can be conventionally encoded as:

| | |
|---|---|
| T1 (2 bytes): | TTT00011 01100XXX |
| T2 (3 bytes): | TTTTT000 00110100 111XXXXX |
| T3 (3 bytes): | TTTTT000 00111010 010XXXXX | which is not very desirable, particularly in view of the fact that it only takes 3 bytes to encode the substring "the " in its uncompressed form, because it does not provide any significant saving of encoded bytes after the compression. This problem is aggravated when there are many compressible substrings which are short but very remote from their respective original copies.

Figure 9:
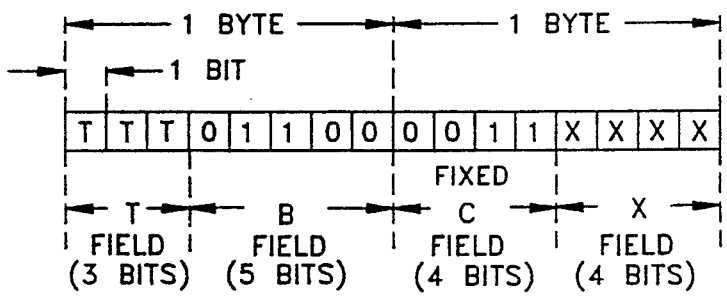
FIG. 9 is an illustrative diagram showing the group of indicators (T, 3, 12, X) encoded according to the format of the present invention stacked token T_2B1 which takes 2 bytes.

However, if the present invention 2-byte stacked tokens are utilized, then all the above three tokens can be encoded within 2 bytes. Referring to FIG. 9, the token T1 of the second "the" can be encoded within 2 bytes in the format of the first 2-byte stacked token T_2B1 of the present invention as:

| | |
|---|---|
| T1 in T_2B1 format (2 bytes): | TTT01100 0011XXXX |

Notice that the backward displacement pointer 12 of token T1 is encoded as "01100"as if encoded conventionally (as shown in FIG. 3).

Figure 10:
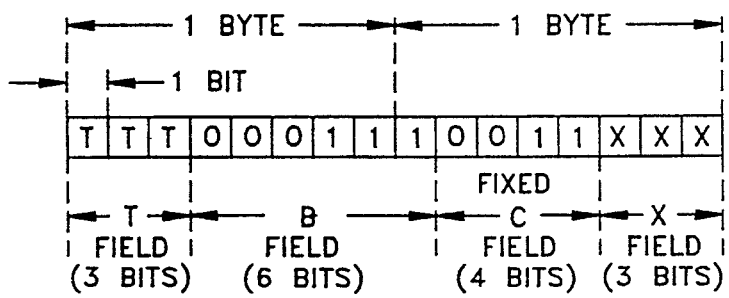
FIG. 10 is an illustrative diagram showing the group of indicators (T, 3, 39, X) encoded according to the format of the present invention stacked tokens T_2B2 which only takes 2 bytes.
Figure 11:
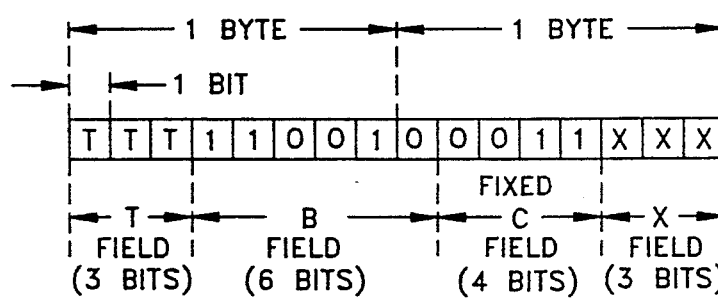
FIG. 11 is an illustrative diagram showing the group of indicators (T, 3, 82, X) encoded according to the format of the present invention stacked tokens T_2B2 which again only takes 2 bytes.

Referring to FIG. 10, the token T2 of the third "the" can also be encoded within 2 bytes in the format of the second 2-byte stacked token T_2B2 of the present invention as:

| | |
|---|---|
| T2 in T_2B2 format (2 bytes): | TTT000111 10011XXX |

Notice here that backward displacement pointer 39 of token T2 is encoded as "000111", which in conventional encoding would depict the number 7 (backward displacement pointer 39 of T2 would conventionally be encoded as "100111", as shown in FIG. 4). However, since the range of numbers for T_2B2 is shifted by 32, the code "000111" in the format of the present invention second 2-byte stacked token T_2B2 depicts backward displacement pointer 39 (=7+32).

Referring to FIG. 10, again the token T3 of the fourth "the" can be encoded within 2 bytes in the format of the second 2-byte stacked token T_2B2 of the present invention as:

| | |
|---|---|
| T3 in T_2B2 format (2 bytes): | TTT11001 00011XXX |

Notice here that backward displacement pointer 82 of token T3 is encoded as "110010", which in conventional encoding would depict number 50 (backward displacement pointer 82 of T3 would conventionally require 7-bits to be encoded as "1010010"). Again, since the range of numbers for T_2B2 is shifted by 32, the code "110010"in the format of the present invention 2-byte stacked token T_2B2 depicts backward displacement pointer 82 (=50+32).

Therefore, the present invention encoding algorithm is clearly superior over the conventional encoding algorithm, because it reduces the number of bytes needed for encoding compressible substrings which are remote from their respective original copies. Furthermore, in most of situations, the number of bytes needed for encoding one of the present invention stacked tokens is limited to 2 bytes.

Figure 12:
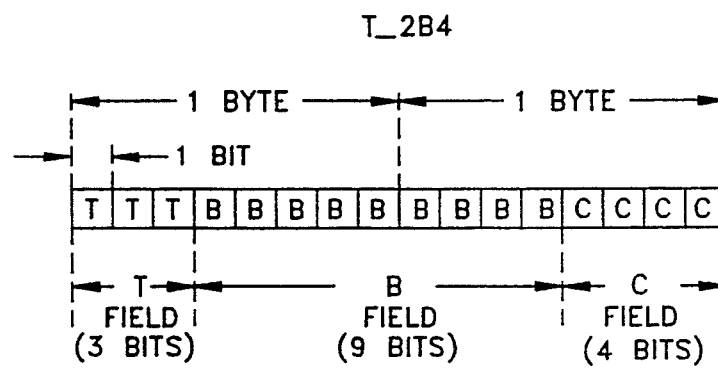
FIG. 12 is an illustrative diagram showing the structure of the fourth 2-byte stacked token T_2B4 of the group of 2-byte stack tokens according to the preferred embodiment of the present invention.

Of course the format of 2-byte stacked tokens described above may vary according to the suitable compression conditions. For example, if no additional indicator X is needed for the compression, then a new 2-byte stacked token T_2B4 may be constructed to have a 3-bit field for encoding the substring type identifier T, a 9-bit field for encoding the backward displacement pointer B, and again a 4-bit field for encoding the substring length counter C, as shown in FIG. 12:

TTTBBBBB BBBBCCCC

Conventionally a 9-bit backward displacement pointer field can only be used to encode numbers up to 511($2^9$-1, encoded as "111111111"). The same number of bits (9 bits) in the present invention 2-byte stack token T_2B4 can be used to encode backward displacement pointers up to 735 (=223+$2^9$). Therefore, the range of backward displacement pointer that can be encoded in the 9-bit backward displacement pointer field of the fourth 2-byte stack token T_2B4 is 224 to 735.

The encoding algorithm of the present invention data compression method may further utilize a group of 3-byte stacked tokens constructed in a similar manner as the group of 2-byte stacked tokens. Examples of such 3-byte stacked tokens T_3B1 and T_3B2 are shown in FIGS. 13 and 14.

Figure 13:
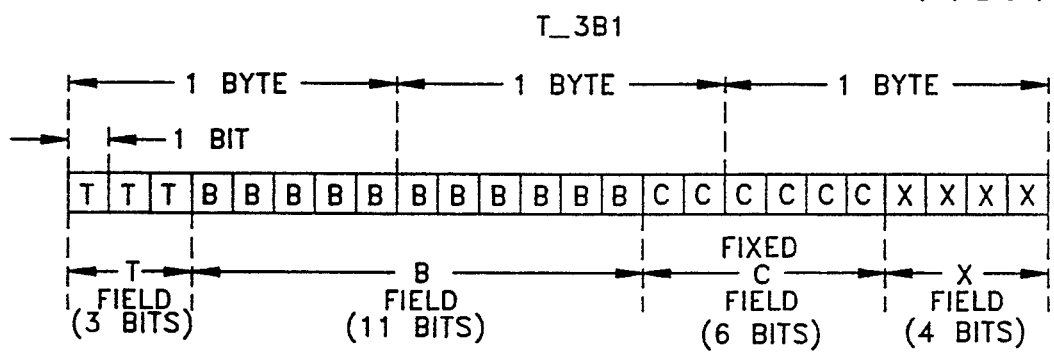
FIG. 13 is an illustrative diagram showing the structure of the first 3-byte stacked token T_3B1 of the group of 3-byte stack tokens according to another embodiment of the present invention.

Referring to FIG. 13, the first 3-byte stacked token T_3B1 has a 3-bit substring type identifier field denoted as "TTT", a 11-bit backward displacement pointer field denoted as "BBBBBBBBBBB", a fixed 6-bit length counter field denoted as "CCCCCC", and a 4-bit additional indicator field denoted as "XXXX":

TTTBBBBB BBBBBBCC CCCCXXXX

Figure 14:
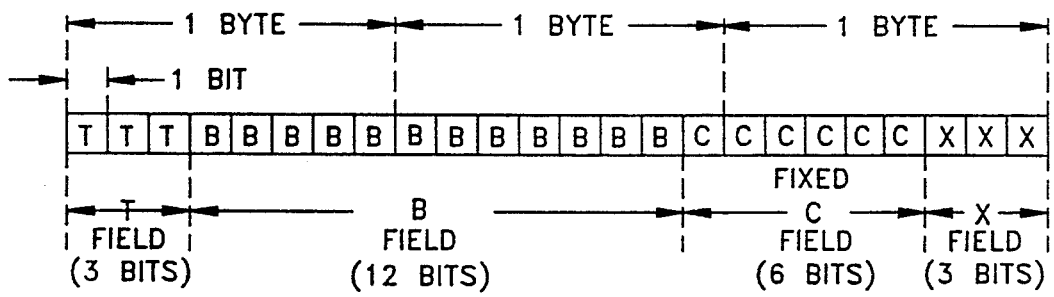
FIG. 14 is an illustrative diagram showing the structure of the second 3-byte stacked token T_3B2 of the group of 3-byte stack tokens according to the other embodiment of the present invention.

Referring to FIG. 14, the second 3-byte stacked token T_3B2 has a 3-bit substring type identifier field denoted as "TTT", a 12-bit backward displacement pointer field denoted as "BBBBBBBBBBBB", a fixed 6-bit length counter field denoted as "CCCCCC", and a 3-bit additional indicator field denoted as "XXX":

TTTBBBBB BBBBBBBC CCCCCXXX

If the two 3-byte stacked tokens T_3B1 and T_3B2 are used in conjunction with the four 2-byte stacked tokens T_2B1, T_2B2, T_2B3 and T_2B4, where the range of backward displacement pointer representable is up to 479, then the range assigned to the 10-bit backward displacement pointer field of the first 3-byte stacked token T_3B1 may be 2783 ($=735+2^{11}$), and the range assigned to the 12-bit backward displacement pointer field of the second 3-byte stacked token T_3B2 may be 6879 ($=2783+2^{12}$).

It should also be noticed that by using the 3-byte stacked tokens, the maximum value of the substring length counter that can be encoded is 63. This is more than enough in most of the cases since it is unusual to have identical substrings as long as having 63 characters.

In addition, the building block of the present invention stacked tokens does not have to be the substring length counter field. In fact, any designated fixed field may be used as the building block or signifier of a particular group of stacked tokens. For example, as shown in FIGS. 15 and 16, the two alternative 2-byte stacked tokens T'_2B1 and T'_2B2 are built on the basis of a fixed 6-bit backward displacement pointer field "BBBBBB", and the respective substring length counter field is stacked.

Figure 15:
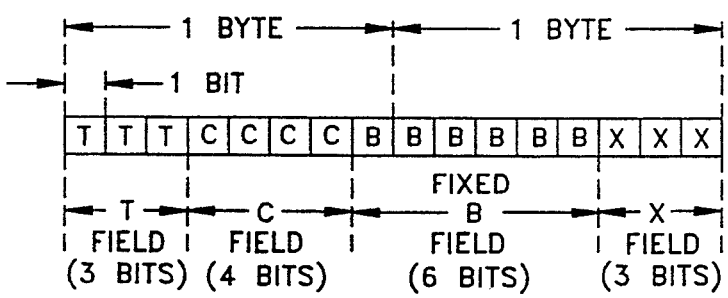
FIG. 15 is an illustrative diagram showing the structure of the first alternative 2-byte stacked token T'_2B1 of the alternative group of 2-byte stack tokens according to an alternative embodiment of the present invention.

Referring to FIG. 15, the first alternative 2-byte stacked token T'_2B1 has a 3-bit substring type identifier field denoted as "TTT", a 4-bit length counter field denoted as "CCCC", a fixed 6-bit backward displacement pointer field denoted as "BBBBBB", and a 3-bit additional indicator field denoted as "XXX":

TTTCCCCB BBBBBXXX

Figure 16:
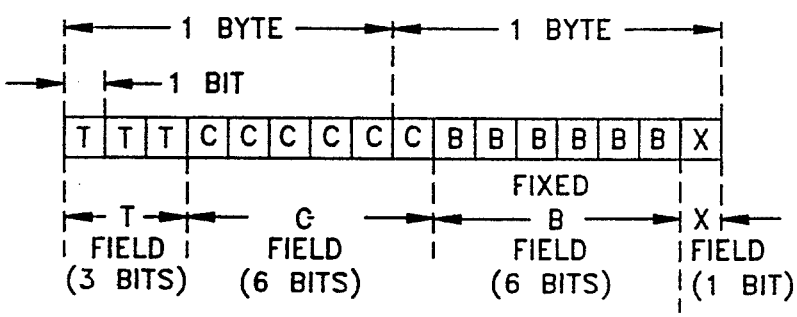
FIG. 16 is an illustrative diagram showing the structure of the second alternative 2-byte stacked token T'_2B2 of the alternative group of 2-byte stack tokens according to an alternative embodiment of the present invention.

Referring to FIG. 16, the second alternative 2-byte stacked token T'_2B2 has a 3-bit substring type identifier field denoted as "TTT", a 6-bit length counter field denoted as "CCCCCC", a fixed 6-bit backward displacement pointer field denoted as "BBBBBB" and a 1-bit additional indicator field denoted as "X":

TTTCCCCC CBBBBBBX

The first alternative 2-byte stacked token T'_2B1 may be used to encode a compressible substring having a backward displacement pointer B of up to 63 and a substring length counter C within the range of 0 to 15, and the second alternative 2-byte stacked token T'_2B2 may be used to encode a compressible substring having a backward displacement pointer B of up to 63 and a substring length counter C within the shifted range of 16 to 79 ($=15+2^6$).

Generally, the present invention is a method of lossless digital data compression. More particularly, the present invention is an encoding algorithm which utilizes a token stacking technique to build a stacked token having shifted encoding ranges for further savings of bytes used for encoding compressed substrings. Furthermore, the particular encoding algorithm of the present invention can be integrated with any kind of matching algorithm to serve as the essential components of any data compression method. In addition, the general data compression method of the present invention can be incorporated with any kind of data expansion method to form a complete data processing system.

Defined in detail, the present invention is an encoding method for use with digital data compression operations which compress an input data string into an output data string containing compressed and uncompressed substrings mixed in series, the encoding method comprising the steps of: (a) constructing a group of stacked tokens including a first 2-byte stacked token and a second 2-byte stacked token each having a plurality of fields including a substring type identifier field, a backward displacement pointer field and a substring length counter field, where the substring length counter field occupies 4 bits and is identical among all stacked tokens in the group for serving as the basis in constructing the group of 2-byte stacked tokens; (b) assigning a respective range of integers to be encoded in said backward displacement pointer field of each respective one of said stacked tokens, where the ranges assigned to said stacked tokens are stacked sequentially without overlapping, particularly the range assigned to said first stacked token is 0 to 31 and the range assigned to said second stacked token is 32 to 95; (c) determining a respective substring type identifier for a respective one of said compressed substrings; (d) determining a respective substring length counter for said respective one of said compressed substrings; (e) determining a respective backward displacement pointer for said respective one of said compressed substrings, which backward displacement pointer is a respective integer count of displacement between the respective one of said compressed substrings and a previously processed identical substring in said mixed series; (f) representing said respective one of said compressed substrings with a respective one of said stacked tokens by encoding a plurality of indicators into said plurality of fields respectively, including encoding said respective substring type identifier into said substring type identifier field of said respective one of said stacked tokens, and encoding said respective substring length counter into said substring length counter field of said respective one of said stacked tokens; (g) further encoding said respective backward displacement pointer into said backward displacement pointer field of the respective one of said stacked tokens according to the range assigned, such that said respective backward displacement pointer falls within the range assigned to said respective one of said stacked tokens, particularly representing said respective one of said compressed substrings with said first 2-byte stacked token when said respective backward displacement pointer of said respective one of said compressed substrings is within the range of 0 to 31 and representing said compressed substrings with said second 2-byte stacked token when said respective backward displacement pointer of said respective one of said compressed substrings is within the range of 32 to 95; and (h) repeating steps (c) through (h) until all of said compressed substrings are represented by one of said stacked tokens; (i) whereby the compressed substring remotely located from its identical substring previously processed can be adequately represented by one of said stacked tokens without increasing the number of bytes required for encoding the remote compressed substring.

Defined broadly, the present invention is an encoding method for use with digital data compression operations which compress an input data string into an output data string containing compressed and uncompressed substrings mixed in series, the encoding method comprising the steps of: (a) constructing a group of stacked tokens each having a plurality of fields including a backward displacement pointer field and a substring length counter field, where the substring length counter field is identical among all stacked tokens in the group for serving as the basis in constructing the group of stacked tokens; (b) assigning a respective range of integers to be encoded in said backward displacement pointer field of each respective one of said stacked tokens, where the ranges assigned to said stacked tokens are stacked sequentially without overlapping; (c) determining a respective substring length counter for a respective one of said compressed substrings; (d) determining a respective backward displacement pointer for said respective one of said compressed substrings, which backward displacement pointer is a respective integer count of displacement between the respective one of said compressed substrings and a previously processed identical substring in said mixed series; (e) representing said respective one of said compressed substrings with a respective one of said stacked tokens by encoding a plurality of indicators into said plurality of fields respectively, including encoding said respective substring length counter into said substring length counter field of said respective one of said stacked tokens, and encoding said respective backward displacement pointer into said backward displacement pointer field of the respective one of said stacked tokens according to the range assigned, such that said respective backward displacement pointer falls within the range assigned to said respective one of said stacked tokens; and (f) repeating steps (c) through (e) until all of said compressed substrings are represented by one of said stacked tokens; (g) whereby the compressed substring remotely located from its identical substring previously processed can be adequately represented by one of said stacked tokens without increasing the number of bytes required for encoding the remote compressed substring.

Defined more broadly, the present invention is a data compression method for compressing an input data string containing a series of compressible substrings, the data compression method comprising the steps of: (a) constructing a group of stacked tokens each having a plurality of fields including a backward displacement pointer field and a substring length counter field, where the substring length counter field is identical among all stacked tokens in the group for serving as the basis in constructing the group of stacked tokens; (b) assigning a respective range of integers to be encoded in said backward displacement pointer field of each respective one of said stacked tokens, where the ranges assigned to said stacked tokens are stacked sequentially without overlapping; (c) identifying a compressible substring of said input data string when there is a previously processed identical substring; (d) determining a backward displacement pointer for said compressible substring, which backward displacement pointer is an integer count of displacement between said compressible substring and said previously processed identical substring; (e) representing said compressible substring with a respective one of said stacked tokens by encoding said backward displacement pointer into said backward displacement pointer field of the respective one of said stacked tokens according to the range assigned, such that said backward displacement pointer falls within the range assigned to the respective one of said stacked tokens; and (f) repeating steps (c) through (e) until all of the compressible substrings are represented by one of said stacked tokens; (g) whereby when said compressible substring is remote from said identical substring previously processed, it can be adequately represented by said respective one of said stacked tokens without increasing the number of bytes required for encoding said compressible substring.

Defined even more broadly, the present invention is a method of encoding a compressible substring for digital data compression operations, the encoding method comprising the steps of: (a) constructing a group of stacked tokens each having a plurality of fields including a backward displacement pointer field and a substring length counter field, where the substring length counter field is identical among all stacked tokens in the group for serving as the basis in constructing the group of stacked tokens; (b) assigning a respective range of integers to be encoded in said backward displacement pointer field of each respective one of said stacked tokens, where the ranges assigned to said stacked tokens are stacked sequentially without overlapping; (c) determining a backward displacement pointer for said compressible substring, which backward displacement pointer is an integer count of displacement between said compressible substring and a previously processed identical substring; and (d) encoding said backward displacement pointer into said backward displacement pointer field of a respective one of said stacked tokens according to the range assigned, such that said backward displacement pointer falls within the range assigned to the respective one of said stacked tokens; (e) whereby when said compressible substring is remotely located from said previously processed identical substring, said compressible substring can be adequately represented by said respective one of said stacked tokens without increasing the number of bytes required for encoding said compressible substring.

Defined most broadly, the present invention is a method of encoding a compressible substring for digital data compression operations, the encoding method comprising the steps of: (a) constructing a group of stacked tokens each having a plurality of fields for encoding a plurality of indicators carrying information of said compressible substring, where at least one of the plurality of fields is identical among all of the stacked tokens in the group for serving as the basis in constructing the group of stacked tokens; (b) assigning a respective range of integers to be encoded in another one of said plurality of fields other than said at least one identical field for each respective one of said stacked tokens, where the ranges assigned to said stacked tokens are stacked sequentially without overlapping; (c) determining at least one of said plurality of indicators for said compressible substring, which carries encoding information of said compressible substring; and (d) encoding said at least one of said plurality of indicators into said another one of said plurality of fields of a respective one of said stacked tokens, where said at least one of said plurality of indicators falls within the range assigned to the respective one of said stacked tokens; (e) whereby said compressible substring can be adequately represented by said respective one of said stacked tokens without increasing the number of bytes required for encoding said compressible substring.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. An encoding method for use with digital data compression operations which compress an input data string into an output data string containing compressed and uncompressed substrings mixed in series, the encoding method comprising the following steps:
   a. constructing a group of stacked tokens each having a plurality of fields including a backward displacement pointer field and a substring length counter field, where the substring length counter field is identical among all stacked tokens in the group for serving as the basis in constructing the group of stacked tokens;
   b. assigning a respective range of integers to be encoded in said backward displacement pointer field of each individual one of said stacked tokens, where the individual ranges of said backward displacement pointer field assigned to said group of stacked tokens cover a larger range, and no individual range of said backward displacement pointer field of said stacked tokens overlaps with the individual range of said backwards displacement field of any other stacked token in the group;
   c. determining a respective substring length counter for a respective one of said compressed substrings;
   d. determining a respective backward displacement pointer for said respective one of said compressed substrings, which backward displacement pointer is a respective integer count of displacement between the respective one of said compressed substrings and a previously processed identical substring in said mixed series;
   e. representing said respective one of said compressed substrings with a respective one of said stacked tokens by encoding a plurality of indicators into said plurality of fields respectively, including encoding said respective substring length counter into said substring length counter field of said respective one of said stacked tokens, and encoding said respective backward displacement pointer into said backward displacement pointer field of the respective one of said stacked tokens according to the range assigned, such that said respective backward displacement pointer falls within the range assigned to said backward displacement pointer field of one of said stacked tokens in the group; and
   f. repeating steps (c) through (e) until all of said compressed substrings are represented by one of said stacked tokens.

2. The encoding method in accordance with claim 1 wherein said stacked tokens are 2-byte tokens each having 16 bits.

3. The encoding method in accordance with claim 2 wherein said substring length counter field in each one of said stacked tokens occupies 4 bits.

4. The encoding method in accordance with claim 2 wherein said ranges include a first range from 0 to 31 and a second range from 32 to 95.

5. The encoding method in accordance with claim 4 wherein said backward displacement pointer field of said stacked token that has been assigned with said first range occupies 5 bits.

6. The encoding method in accordance with claim 4 wherein said backward displacement pointer field of said stacked token that has been assigned with said second range occupies 6 bits.

7. The encoding method in accordance with claim 4 wherein said ranges further include a third range from 96 to 223.

8. The encoding method in accordance with claim 7 wherein said backward displacement pointer field of said stacked token that has been assigned with said third range occupies 7 bits.

9. The encoding method in accordance with claim 1 wherein said group of stacked tokens are 3-byte tokens each having 24 bits.

10. The encoding method in accordance with claim 1 wherein said plurality of fields of each one of said stacked tokens further includes a substring type identifier field for encoding a substring type identifier.

11. An encoding method for use with digital data compression operations which compress an input data string into an output data string containing compressed and uncompressed substrings mixed in series, the encoding method comprising the following steps:
   a. constructing a group of stacked tokens including a first 2-byte stacked token and a second 2-byte stacked token each having a plurality of fields including a substring type identifier field, a backward displacement pointer field and a substring length counter field, where the substring length counter field occupies 4 bits and is identical among all stacked tokens in the group for serving as the basis in constructing the group of 2-byte stacked tokens;
   b. assigning a respective range of integers to be encoded in said backward displacement pointer field of each individual one of said stacked tokens, where the individual ranges of said backward displacement pointer field assigned to said group of stacked tokens cover a larger range, and no individual range of said backwards displacement pointer field of said stacked token overlaps with the individual range of said backward displacement field of any other stacked tokens in the group, particularly when the range assigned to said backward displacement pointer field of first stacked token is 0 to 31, and the range of said backwards displacement field of second stacked token is 32 to 95;
   c. determining a respective substring type identifier for a respective one of said compressed substrings;
   d. determining a respective substring length counter for said respective one of said compressed substrings;
   e. determining a respective backward displacement pointer for said respective one of said compressed substrings, which backward displacement pointer is a respective integer count of displacement between the respective one of said compressed substrings and a previously processed identical substring in said mixed series;
   f. representing said respective one of said compressed substrings with a respective one of said stacked tokens by encoding a plurality of indicators into said plurality of fields respectively, including encoding said respective substring type identifier into said substring type identifier field of said respective one of said stacked tokens, and encoding said respective substring length counter into said substring length counter field of said respective one of said stacked tokens;

g. further encoding said respective backward displacement pointer into said backward displacement pointer field of the respective one of said stacked tokens according to the range assigned, such that said respective backward displacement pointer falls within the range assigned to said respective one of said stacked tokens, particularly representing said respective one of said compressed substrings with said first 2-byte stacked token when said respective backward displacement pointer of said respective one of said compressed substrings is within the range of 0 to 31 and representing said compressed substrings with said second 2-byte stacked token when said respective backward displacement pointer of said respective one of said compressed substrings is within the range of 32 to 95; and h. repeating steps (c) through (h) until all of said compressed substrings are represented by one of said stacked tokens.

12. The encoding method in accordance with claim 11 wherein said backward displacement pointer field of said first 2-byte stacked token occupies 5 bits.

13. The encoding method in accordance with claim 11 wherein said backward displacement pointer field of said second 2-byte stacked token occupies 6 bits.

14. The encoding method in accordance with claim 11 wherein said group of stacked tokens further includes a third 2-byte stacked token.

15. The encoding method in accordance with claim 14 wherein particularly the range assigned to said third 2-byte stacked token is 96 to 223.

16. The encoding method in accordance with claim 15 wherein said backward displacement pointer field of said third stacked token occupies 7 bits.

17. The encoding method in accordance with claim 11 wherein said group of stacked tokens further includes a fourth 2-byte stacked token.

18. The encoding method in accordance with claim 17 wherein particularly the range assigned to said fourth 2-byte stacked token is 224 to 479.

19. The encoding method in accordance with claim 18 wherein said backward displacement pointer field of said fourth stacked token occupies 8 bits.

20. The encoding method in accordance with claim 11 wherein said plurality of fields of each one of said stacked tokens further includes a field for encoding an additional indicator carrying additional encoding information.

21. A data compression method for compressing an input data string containing a series of compressible substrings, the data compression method comprising the following steps:

a. constructing a group of stacked tokens each having a plurality of fields including a backward displacement pointer field and a substring length counter field, where the substring length counter field is identical among all stacked tokens in the group for serving as the basis in constructing the group of stacked tokens;

b. assigning a respective range of integers to be encoded in said backward displacement pointer field of each individual one of said stacked tokens, where the individual ranges of said backward displacement pointer field assigned to said stacked tokens cover a larger range, and no individual range of said backward displacement pointer fields of said stacked tokens overlaps with the individual range of said backwards displacement field of any other stacked token in the group;

c. identifying a compressible substring of said input data string when there is a previously processed identical substring;

d. determining a backward displacement pointer for said compressible substring, which backward displacement pointer is an integer count of displacement between said compressible substring and said previously processed identical substring;

e. representing said compressible substring with a respective one of said stacked tokens by encoding said backward displacement pointer into said backward displacement pointer field of the respective one of said stacked tokens according to the range assigned, such that said backward displacement pointer falls within the range assigned to the respective one of said stacked tokens; and f. repeating steps (c) through (e) until all of the compressible substrings are represented by one of said stacked tokens.

22. The encoding method in accordance with claim 21 wherein said stacked tokens are 2-byte tokens each having 16 bits.

23. The encoding method in accordance with claim 21 wherein said group of stacked tokens are 3-byte tokens each having 24 bits.

24. The encoding method in accordance with claim 21 further comprising the step of determining a substring length counter for said compressible substring.

25. The encoding method in accordance with claim 24 wherein the step of representing said compressible substring with a respective one of said stacked tokens further includes encoding said substring length counter into said substring length counter field of said respective one of said stacked tokens.

26. A method of encoding a compressible substring for digital data compression operations, the encoding method comprising the steps of:

a. constructing a group of stacked tokens each having a plurality of fields including a backward displacement pointer field and a substring length counter field, where the substring length counter field is identical among all stacked tokens in the group for serving as the basis in constructing the group of stacked tokens;

b. assigning a respective range of integers to be encoded in said backward displacement pointer field of each individual one of said stacked tokens, where the individual ranges of said backward displacement pointer field assigned to said group of stacked tokens cover a larger range, and no individual range of said backward displacement pointer fields of said stacked tokens overlaps with the individual range of said backwards displacement field of any other stacked token in the group;

c. determining a backward displacement pointer for said compressible substring, which backward displacement pointer is an integer count of displacement between said compressible substring and a previously processed identical substring; and d. encoding said backward displacement pointer into said backward displacement pointer field of a respective one of said stacked tokens according to the range assigned, such that said backward displacement pointer falls within the range assigned to the respective one of said stacked tokens.

27. The encoding method in accordance with claim 26 wherein said stacked tokens are 2-byte tokens each having 16 bits.

28. The encoding method in accordance with claim 26 wherein said group of stacked tokens are 3-byte tokens each having 24 bits.

29. The encoding method in accordance with claim 26 further comprising the step of determining a substring length counter for said compressible substring.

30. The encoding method in accordance with claim 29 wherein the step of representing said compressible substring with a respective one of said stacked tokens further includes encoding said substring length counter into said substring length counter field of said respective one of said stacked tokens.

31. A method of encoding a compressible substring for digital data compression operations, the encoding method comprising the following steps:

a. constructing a group of stacked tokens each having a plurality of fields for encoding a plurality of indicators carrying information of said compressible substring, where at least one of the plurality of fields is identical among all of the stacked tokens in the group for serving as the basis in constructing the group of stacked tokens;

b. assigning a respective range of integers to be encoded in another one of said plurality of fields other than said at least one identical field for each individual one of said stacked tokens, where the individual ranges of said field assigned to said stacked tokens cover a larger range, and no individual range of said field of said stacked token overlaps with the individual range of said field of any other stacked token in the group;

c. determining at least one of said plurality of indicators for said compressible substring, which carries encoding information of said compressible substring; and d. encoding said at least one of said plurality of indicators into said another one of said plurality of fields of a respective one of said stacked tokens, where said at least one of said plurality of indicators falls within the range assigned to the respective one of said stacked tokens.

32. The encoding method in accordance with claim 31 wherein said stacked tokens are 2-byte tokens each having 16 bits.

33. The encoding method in accordance with claim 32 wherein said ranges include a first range from 0 to 31 and a second range from 32 to 95.

34. The encoding method in accordance with claim 33 wherein said at least one of said plurality of fields that has been assigned with said first range occupies 5 bits.

35. The encoding method in accordance with claim 33 wherein said at least one of said plurality of fields that has been assigned with said second range, occupies 6 bits.

36. The encoding method in accordance with claim 31 wherein said group of stacked tokens are 3-byte tokens each having 24 bits.

37. The encoding method in accordance with claim 31 wherein said at least one of said plurality of fields is a substring length counter field.

38. The encoding method in accordance with claim 37 wherein said another one of said plurality of fields is a backward displacement pointer field.

39. The encoding method in accordance with claim 31 wherein said at least one of said plurality of fields is a backward displacement pointer field.

40. The encoding method in accordance with claim 39 wherein said another one of said plurality of fields is a substring length counter field.

41. An encoding method for data compression operations comprising the following steps:

a. building a group of tokens each having at least two fields, where one of the at least two fields is determined among all of the tokens in the group for serving as the basis in building the group of tokens and wherein one of said at least two fields is a substring length counter; and b. assigning a respective encoding range to the other one of said at least two fields in each respective one of said tokens, where the encoding ranges assigned to said tokens cover a larger range and no individual range overlaps with the individual range of any other stacked token in the group.

42. The encoding method in accordance with claim 41 wherein the other one of said at least two fields is a backward displacement pointer.

43. The encoding method in accordance with claim 41 wherein the other one of said at least two fields is an offset pointer.

44. The encoding method in accordance with claim 41 wherein the other one of said at last two fields is a dictionary entry pointer.

* * * * *